United States Patent
Wu

(10) Patent No.: US 6,617,565 B2
(45) Date of Patent: Sep. 9, 2003

(54) CMOS IMAGE SENSOR WITH ON-CHIP PATTERN RECOGNITION

(75) Inventor: Raymond Wu, Los Gatos, CA (US)

(73) Assignee: OmniVision Technologies, Inc., Sunnyvale, CA (US)

( * ) Notice: Subject to any disclaimer, the term of this patent is extended or adjusted under 35 U.S.C. 154(b) by 0 days.

(21) Appl. No.: 10/011,507

(22) Filed: Nov. 6, 2001

(65) Prior Publication Data

US 2003/0085336 A1 May 8, 2003

(51) Int. Cl.[7] .............................. H01L 27/00; G06K 9/20
(52) U.S. Cl. ..................... 250/208.1; 382/107; 382/312
(58) Field of Search ....................... 250/208.1; 382/107, 382/312, 313, 106; 706/20; 235/462.11

(56) References Cited

U.S. PATENT DOCUMENTS

| | | | | |
|---|---|---|---|---|
| 5,129,040 A | * | 7/1992 | Hanazato et al. | |
| 5,302,838 A | * | 4/1994 | Roenker et al. | |
| 5,416,891 A | * | 5/1995 | Isoda et al. | |
| 5,621,863 A | | 4/1997 | Boulet et al. | |
| 5,703,353 A | * | 12/1997 | Blalock et al. | |
| 5,717,832 A | | 2/1998 | Steimle et al. | |
| 6,011,295 A | * | 1/2000 | Merrill | |
| 6,123,261 A | * | 9/2000 | Roustaei | |
| 6,233,368 B1 | * | 5/2001 | Badyal et al. | |

* cited by examiner

Primary Examiner—David Porta
Assistant Examiner—David C Meyer
(74) Attorney, Agent, or Firm—Perkins Coie LLP

(57) ABSTRACT

An integrated circuit is disclosed that includes a sensor array formed on the integrated circuit. The sensor array outputs raw image data. The integrated circuit also includes a processing circuit. The processing circuit receives the raw image data and outputs a feature set based upon the raw image data.

2 Claims, 2 Drawing Sheets

CMOS IMAGE SENSOR WITH ON-CHIP PATTERN RECOGNITION

TECHNICAL FIELD OF THE INVENTION

The present invention relates generally to CMOS image sensors, and more particularly, to a single chip image sensor having integrated therewith pattern recognition circuitry.

BACKGROUND OF THE INVENTION

CMOS image sensors are used in a variety of applications. From optical mice, to PC cameras, to security cameras, CMOS image sensors have proven their ability to supplant CCD technology. With their lower cost and lower power consumption, CMOS image sensors have become an important alternative to CCD'S.

In many applications, the image captured by the image sensor is not simply output for viewing. Instead, the image sensor data is used for other purposes, such as to detect movement in an optical mouse, or to detect movement in objects. As one example, image sensors used in toys or machine vision devices are often used to detect movement. The image sensors also are often used to identify shapes or objects in the image field.

For these applications, significant signal processing on the images must be performed. Typically, the signal processing is performed on a separate chip by a conventional digital signal processor, a microprocessor, or other logic device, such as a field programmable gate array (FPGA) or programmable logic device (PLD).

However, the use of additional chips for signal processing is expensive. For example, a large FPGA with millions of gates may cost upwards of $10 per unit. For pattern recognition applications, it is not necessary to use a large FPGA. Moreover, smaller gate count FPGA's are not readily available. Therefore, a standard high processing power FPGA is used, with much of the processing power of the FPGA is wasted.

BRIEF DESCRIPTION OF THE DRAWINGS

In the drawings, like reference numerals refer to like parts throughout the various views of the non-limiting and non-exhaustive embodiments of the present invention, and wherein.

DETAILED DESCRIPTION OF THE ILLUSTRATED EMBODIMENTS

In the following description, numerous specific details are provided, such as the identification of various system components, to provide a thorough understanding of embodiments of the invention. One skilled in the art will recognize, however, that the invention can be practiced without one or more of the specific details, or with other methods, components, materials, etc. In still other instances, well-known structures, materials, or operations are not shown or described in detail to avoid obscuring aspects of various embodiments of the invention.

Reference throughout this specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
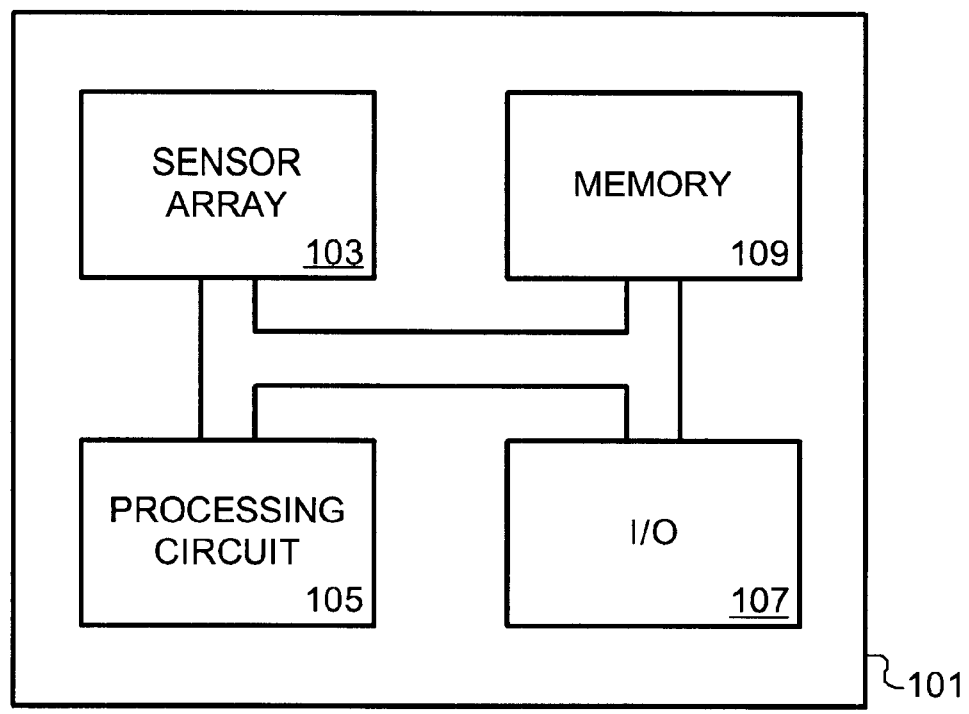
FIG. 1 is a schematic diagram of an integrated circuit formed in accordance with the present invention.

Turning to FIG. 1, an integrated circuit 101 formed in accordance with the present invention includes a sensor array 103, a processor circuit 105, an input/output (I/O) 107, memory 109, and bus 111. Preferably, each of these components is formed on a single silicon substrate and manufactured to be integrated onto a single chip using standard CMOS processes.

The sensor array 103 portion may be, for example, substantially similar to the sensor arrays portions of image sensors manufactured by the assignee of the present invention, OmniVision Technologies, Inc., of Sunnyvale, Calif., as model numbers OV7630, OV7920, OV7930, OV9620, OV9630, OV6910, or OV7640.

More specifically, the sensor array 103 includes a plurality of individual pixels arranged in a two-dimensional array. In operation, as an image is focused onto the sensor array 103, the sensor array 103 can obtain the raw image data.

The raw image data is then received by the processor circuit 105 via bus 111 to begin signal processing. The processor circuit 105 is capable of executing a set of preprogrammed instructions (perhaps stored in memory 107) necessary to carry out the functions of the integrated circuit 101. In one embodiment, the integrated circuit 105 may be used for machine vision applications. For example, the integrated circuit 105 may be programmed to look for designated features. Thus, if the integrated circuit 105 is incorporated into a toy car or toy animal, the car or animal can be programmed to follow certain shaped objects, such as a hand, a human body, or the edge of a table.

The processor circuit 105 may be a FPGA or a neuron circuit. In one embodiment, the FPGA may be of similar design as that available from Altera or Xilinx. Importantly, the FPGA is manufactured to be integrated on the same substrate as the sensor array 103, memory 109, and I/O 107. Thus, instead of having to use an image sensor integrated circuit that outputs raw image data to a separate, and typically expensive, high gate count FPGA, the present invention integrates all of these functions onto a single low cost, low power chip.

Alternatively, the processor circuit 105 may be a neuron based circuit. Neuron based circuitry has proved promising in pattern recognition applications. The massively parallel capabilities and the ability to "learn" of neuron circuitry is particularly adapted for an integrated circuit of the present invention that incorporates image sensor functionality with pattern recognition capability. The design of the neuron circuit may be obtained from a number of companies, including Silicon Recognition, Inc. of California. Also, further detail on the design of neuron circuitry can be found in U.S. Pat. No. 5,717,832 and U.S. Pat. No. 5,621,863 and patent properties referenced therein.

In the context of the presently illustrated embodiments, the processor circuit 105 is programmed to obtain raw image data and process the raw image data to extract a feature set for a successive series of raw image data. Feature sets of successive images are compared, and using known algorithms, such as that described in U.S. Pat. No. 6,256,016, U.S. Pat. No. 5,644,139, or U.S. Pat. No. 6,172,354. Other algorithms exist that may be used to determine relative motion based upon successive frames of image data.

For example, a feature extraction technique may be used that is described in a co-pending application filed Nov. 6, 2001 and assigned to the assignee of the present invention, entitled "METHOD AND APPARATUS FOR DETERMINING RELATIVE MOVEMENT IN AN OPTICAL MOUSE USING FEATURE EXTRACTION" to Shi Ge and herein incorporated by reference. Alternatively, non-feature based techniques may be used that is described in a co-pending application filed Nov. 6, 2001 and assigned to the assignee of the present invention, entitled "METHOD AND APPARATUS FOR DETERMINING RELATIVE MOVEMENT IN AN OPTICAL MOUSE" to Xiaodong Luo and herein incorporated by reference.

Thus, the processor circuit 105 is used to calculate movement based upon successive images captured by the sensor array 103. Once the movement has been calculated, the processor circuit 105 provides X and Y movement coordinates to I/O 109, which in turn outputs the information.

Figure 2A:
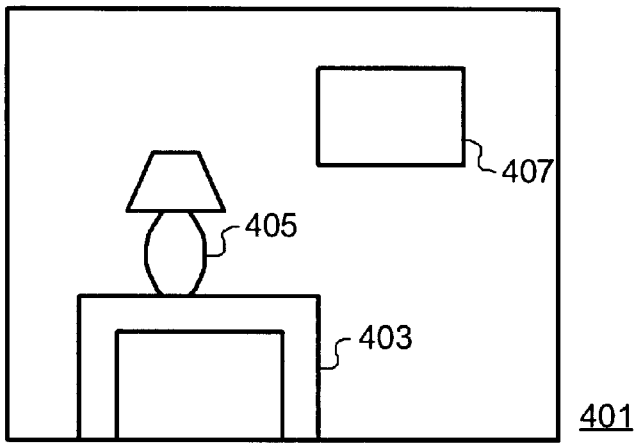
FIGS. 2A and 2B are examples of two images taken by the integrated circuit of FIG. 1 showing relative movement.
Figure 2B:
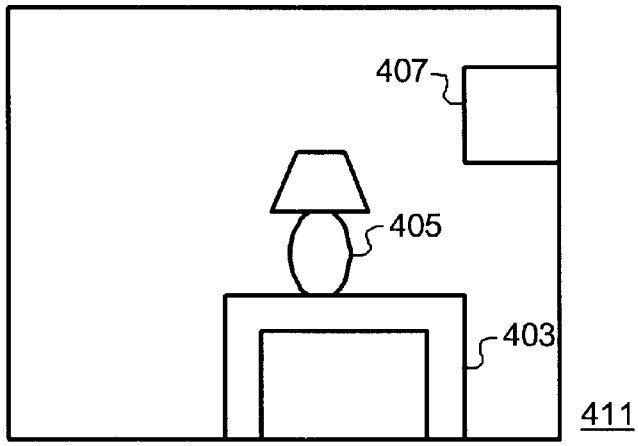

As one example of the analysis, turning to FIGS. 2A and 2B, the processor circuit 105 receives the raw image data from a first image 401 (shown in FIG. 2A). In this example, the first image 401 is an image of a wall of a room, such as an office or den. In this example, the first image 401 includes a table 403, a lamp 405, and a picture 407.

After receiving the first image 401, the processor circuit 105 may then extract a feature set from the raw image data of a first image 401. For example, using known algorithms and methods, such as from machine vision applications, a feature set (also referred to as an abstraction) may be generated from the first image 401. The feature set may be, for example, outlines of the table 403, lamp 405, and picture 407. The feature set may be, in an alternative embodiment, areas of the image 401 that are bright or unusually colorful. It can be appreciated that the particular approach to extraction and generation of the feature set is not critical to the present invention.

After extracting the feature set from the raw image data of a first image 401, the processor circuit 105 may store that feature set in memory 107. Next, the feature set of a second image 411 (shown in FIG. 2B), successive in time to the first image is extracted using the same techniques as for the first image 401. A comparison of the feature set of the second image to the feature set of the first image may be done to determine the magnitude and direction of motion of the integrated circuit 101. The magnitude and direction of motion of the integrated circuit 101 is also referred to as a movement vector.

Specifically, as seen in FIG. 2B, the second image 411 when compared to the first image 401 indicates that the integrated circuit 101 has been shifted laterally to the left by a finite and quantifiable amount. Of course, the comparison in the present invention is performed by processor circuit 105 by comparing the feature sets from the first image 401 and the second image 411. Using known algorithms and methods, the processor can determine the amount of translation, both horizontally and vertically, of successive images. Examples of these algorithms and methods may be seen in the '016 patent and the '354 patent discussed above.

The processor circuit 105, based upon the amount of translation in successive images and the image rate (in terms of image frames per second). In one embodiment, the sensor array 105 is configured to obtain images at a rate of 1000 frames per second. However, it can be appreciated that this rate may be changed based upon the anticipated maximum speed by which the integrated circuit 101 will be moved.

While the invention is described and illustrated here in the context of a limited number of embodiments, the invention may be embodied in many forms without departing from the spirit of the essential characteristics of the invention. The illustrated and described embodiments are therefore to be considered in all respects as illustrative and not restrictive. The scope of the invention is indicated by the appended claims rather than by the foregoing description, and all changes which come within the meaning and range of equivalency of the claims are intended to be embraced therein.

What is claimed is:

1. An CMOS image sensor for providing a movement vector based on relative movement of successive images received by the image sensor, said movement vector used to control the movement of a machine, the image sensor comprising:
   (a) a sensor array operative to receive ambient images and output a signal indicative of said ambient images, said sensor array being a two-dimensional array of active pixels; and
   (b) a processor circuit for receiving said signal indicative of said ambient image, said processor operative to receive at least two successive ambient images and determine and output said movement vector based upon a comparison of said at least two successive ambient images, said processor circuit being a neuron circuit, said processor circuit being separate from said sensor array but on the same integrated circuit.

2. The image sensor of claim 1 wherein said active pixels utilize a photodiode or photogate as the light sensing element.

* * * * *

UNITED STATES PATENT AND TRADEMARK OFFICE
CERTIFICATE OF CORRECTION

PATENT NO.     : 6,617,565 B2
DATED          : September 9, 2003
INVENTOR(S)    : Raymond Wu It is certified that error appears in the above-identified patent and that said Letters Patent is hereby corrected as shown below:

<u>Title page,</u>
Item [*] Notice, "35 U.S.C. 154(b) by 0 days" should be
-- 35 U.S.C. 154(b) by 80 days --;

Signed and Sealed this

Twenty-third Day of December, 2003

JAMES E. ROGAN
*Director of the United States Patent and Trademark Office*